United States Patent
Lan et al.

(10) Patent No.: US 7,462,956 B2
(45) Date of Patent: Dec. 9, 2008

(54) HIGH EFFICIENCY NLTL COMB GENERATOR USING TIME DOMAIN WAVEFORM SYNTHESIS TECHNIQUE

(75) Inventors: Xing Lan, La Palma, CA (US); Mark Kintis, Manhattan Beach, CA (US); Flavia S. Fong, Monterey Park, CA (US)

(73) Assignee: Northrop Grumman Space & Mission Systems Corp., Los Angeles, CA (US)

( * ) Notice: Subject to any disclaimer, the term of this patent is extended or adjusted under 35 U.S.C. 154(b) by 156 days.

(21) Appl. No.: 11/651,989

(22) Filed: Jan. 11, 2007

(65) Prior Publication Data

US 2008/0169846 A1  Jul. 17, 2008

(51) Int. Cl.
H03K 3/64 (2006.01)
H03K 5/06 (2006.01)
H03K 5/12 (2006.01)
(52) U.S. Cl. .................................... 307/106; 327/100
(58) Field of Classification Search .................. 307/106, 307/108; 327/100, 105; 333/20
See application file for complete search history.

(56) References Cited

U.S. PATENT DOCUMENTS

| | | | |
|---|---|---|---|
| 4,956,568 A * | 9/1990 | Su et al. ..................... | 327/321 |
| 5,378,939 A | 1/1995 | Marsland et al. | |
| 5,789,994 A | 8/1998 | Case et al. | |
| 5,804,921 A | 9/1998 | McEwan et al. | |
| 6,140,822 A | 10/2000 | Williamms | |
| 6,239,637 B1 | 5/2001 | Williamson | |
| 6,311,158 B1 | 10/2001 | Laroche | |
| 6,320,480 B1 | 11/2001 | Kintis et al. | |
| 6,396,338 B1 | 5/2002 | Huang et al. | |
| 6,480,728 B1 | 11/2002 | Mansour | |
| 6,515,622 B1 | 2/2003 | Izadpanah et al. | |
| 6,538,525 B1 | 3/2003 | Williamson | |

(Continued)

FOREIGN PATENT DOCUMENTS

WO  WO 2006/015367 A1  2/2006

OTHER PUBLICATIONS

Caspers et al., F. "High Gradients by Simultaneous Multifrequency Operation of RF Structure." *IEEE* (1987): pp. 112-114. <http://accelconf.web.cern.ch/AccelConf/p87/PDF/PAC1987$_{13}$0112.PDF>.

(Continued)

*Primary Examiner*—David Mis
(74) *Attorney, Agent, or Firm*—Posz Law Group, PLC

(57) ABSTRACT

A device and method are disclosed for synthesizing a waveform having pulse segments. An exemplary generator can include units having a time delay element and pulse generator generating the pulse segments. An input divider divides an input signal into signal instances that propagate through the units and an output combiner combines pulse segments to form the waveform. The pulse generators include a sharpening circuit for sharpening a rising edge and a falling edge of the pulse segments. The sharpening circuit includes a tunable delay element coupled to a non-linear transmission line (NLTL). Another NLTL can be coupled in parallel with the tunable delay element and the first NLTL. The NLTLs include input sections coupled to anodes or cathodes of Schottky diode elements, and the respective cathodes or anodes are coupled to a signal ground.

20 Claims, 8 Drawing Sheets

U.S. PATENT DOCUMENTS

| | | |
|---|---|---|
| 6,690,247 B2 * | 2/2004 | Kintis et al. .................. 333/20 |
| 7,085,499 B2 | 8/2006 | Yap et al. |
| 7,135,917 B2 | 11/2006 | Kozyrev et al. |
| 7,193,486 B2 * | 3/2007 | Mrozek et al. ................ 333/20 |
| 2002/0006171 A1 | 1/2002 | Nielsen |
| 2004/0005000 A1 | 1/2004 | Shake et al. |
| 2004/0174928 A1 | 9/2004 | Siwiak et al. |
| 2004/0227581 A1 | 11/2004 | Noujeim |
| 2005/0042993 A1 | 2/2005 | Cremin et al. |
| 2005/0128020 A1 | 6/2005 | Agoston et al. |
| 2006/0158277 A1 | 7/2006 | Mrozek et al. |

OTHER PUBLICATIONS

Thomas et al., Wayne, "Comb Generator with Excellent Harmonic Flatness to >40 GHz." *Picosecond Pulse Labs (PSPL)*, (2003), pp. 1-3. http://www.picosecond.com/objects/MTT%202003%20PSPL%20Comb%20Generator&20Paper.pdf.

* cited by examiner

HIGH EFFICIENCY NLTL COMB GENERATOR USING TIME DOMAIN WAVEFORM SYNTHESIS TECHNIQUE

FIELD OF THE INVENTION

The present invention relates generally to the generation of a spectrum of frequency harmonics also known as a frequency comb from an input signal. In particular, the present invention relates to a high performance comb generator using a combination of non linear transmission line (NLTL) elements.

BACKGROUND

Comb generators are a common manner of producing a series of frequency harmonics known as a "comb" from a single input signal. The output spectrum of harmonics can then be used in various applications, software or hardware into which the comb generator can be incorporated such as in frequency synthesizers, frequency multipliers, test sets, or the like, or can be combined with other elements such as bandpass filters, amplifiers and the like to form various kinds of equipment.

Common comb generator designs incorporate step recovery diodes (SRDs) that are used to sharpen an edge of an input signal, which, in accordance with Fourier principals, results in an increase in the scope and magnitude of the harmonics across the frequency spectrum. In other words, the sharp time domain transition associated with the sharpened edge results in increased energy across the frequency spectrum at frequencies corresponding to at least one set of harmonics associated with the input signal frequency such as the set of odd or the set of even harmonics of the input signal frequency.

Limitations arise however with SRD-based comb generators. For example, as harmonics frequencies increase, SRD efficiency drops monotonically. Accordingly, most of the harmonic energy is wasted in the lower frequency bands that are often undesired for practical use. In microwave applications, for example, a comb generator is chose based on the ability to generate output tones in higher harmonic frequency bands so as to minimize the number of frequency multipliers required in the system. As will be appreciated by those skilled in the art, the spectrum output level associated with an SRD based generator roughly follows a 1/n drop. Further a typical SRD based generator does not operate well at frequencies above 20 GHz and often experiences instability with performance repeatability issues. Extensive tuning and re-calibration is often required with SRD based generators to achieve acceptable performance.

Other means for generating harmonics exist such as through the use of fiber optic or photonic processing of an input pulse in a series of optical components. Problems with the fiber optic approach however include the expense and complicated nature of the equipment, excess power consumption and the relative unsuitability of the approach for use in a small scale integrated application.

In general some prior art approaches exist to generate sharp edges, however these approaches include simply shaping of existing pulse trains, use of DC level shifts, and the like. Other approaches involve the use of a stub to generate a reflected signal for edge sharpening. However such approaches disrupt the transmission line impedance properties of the system and can cause circuit matching problems and other anomalies over wider portions of the frequency band.

It would therefore be desirable for a comb generator having a high efficiency and high performance in high frequency applications. Such a comb generator could preferably provide a flat output spectrum in the desired harmonic frequency band and have little or no wasted energy in lower frequency harmonic bands.

BRIEF DESCRIPTION OF THE DRAWINGS

The accompanying figures, where like reference numerals refer to identical or functionally similar elements throughout the separate views and which together with the detailed description below, are incorporated in and form part of the specification, serve to further illustrate various embodiments and to explain various principles and advantages all in accordance with the present invention.

DETAILED DESCRIPTION OF THE PREFERRED EMBODIMENTS

Figure 1:
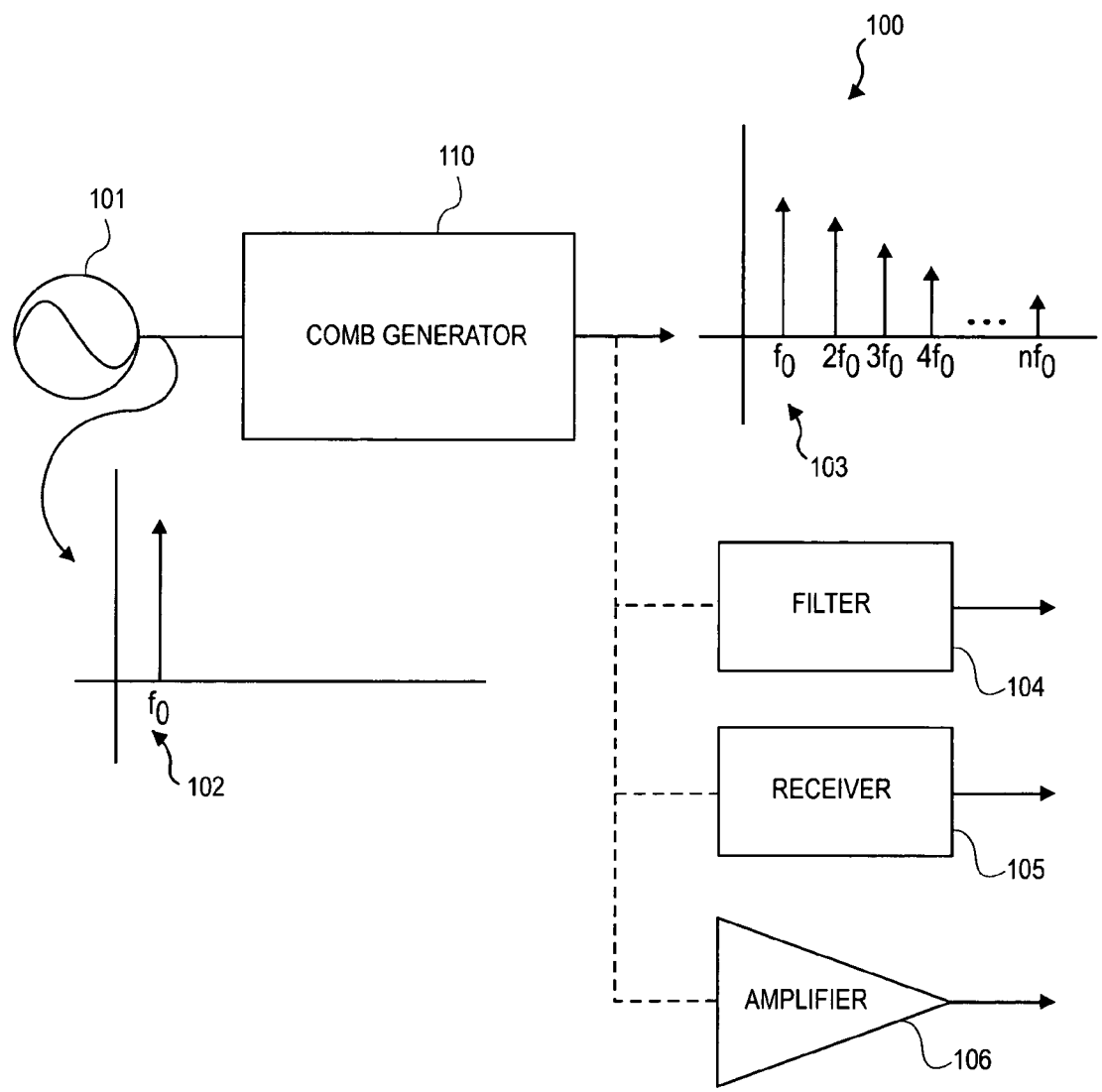
FIG. 1 is a diagram illustrating a typical comb generator system with an input signal and output spectrum.

In accordance with various exemplary embodiments, a method and device are provided for synthesizing a time domain waveform. The time domain waveform advantageously produces a flat output spectrum in a selected frequency band.

The exemplary method can include forming a first pulse segment associated with the time domain waveform using a first non-linear transmission line (NLTL) pulse generator, forming a second pulse segment associated with the time domain waveform is formed using a second NLTL pulse generator, and forming a third pulse segment associated with the time domain waveform using a third NLTL pulse generator. The first pulse segment, the second pulse segment and the third pulse segment are combined to form the time domain waveform. It will be appreciated that the pulse segments are formed by inputting a sinusoidal waveform having a predetermined frequency, such as 1 GHz associated with the selected frequency band of, for example, around 10 GHz to around 20 GHz, into the respective pulse generators. The pulse segments are formed by the respective pulse generators by sharpening a rising edge and a falling edge of each of the pulse segments as the sinusoidal waveform propagates in the pulse generators.

In order to sharpen the rising edge and the falling edge of the respective pulse segments, the sinusoidal waveform is divided into a first and a second waveform instance, which are input into a first tunable delay element coupled to a first NLTL and a second NLTL. The first tunable delay element can be tuned to sharpen the rising edge and the falling edge of the pulse segments.

In accordance with other embodiments, a waveform synthesizer is disclosed for synthesizing a waveform, such as a composite waveform having, for example, a first pulse segment, a second pulse segment and a third pulse segment. The waveform generates a flat output spectrum in a selected frequency band such as between around 10 GHz to around 20 GHz, or other frequency bands. The exemplary waveform synthesizer includes a first unit having a first time delay element and a first pulse generator generating the first pulse segment, a second unit having a second time delay element and a second pulse generator generating the second pulse segment, and a third unit having a third time delay element and a third pulse generator generating the third pulse segment, the first unit, the second unit and the third unit are preferably connected in parallel.

An input divider is coupled to respective inputs of the first unit, the second unit, and the third unit. The input divider divides an input signal, such as a sinusoidal waveform having a frequency of, for example, around 1 GHz, or other frequencies, into a first signal instance, a second signal instance and a third signal instance that propagate through the first unit the second unit and the third unit to form the first pulse segment, the second pulse segment and the third pulse segment respectively. An output combiner coupled to respective outputs of the first unit, the second unit, and the third unit combines the first pulse segment, the second pulse segment and the third pulse segment to form the waveform.

It will be appreciated that each of the first pulse generator, the second pulse generator, and the third pulse generator include a sharpening circuit for sharpening both a rising edge and a falling edge of the respective pulse segments. The sharpening circuit can include a tunable delay element coupled to a first non-linear transmission line (NLTL) and a second NLTL coupled in parallel with the tunable delay element and the first NLTL. In accordance with various configurations, the first NLTL can include an input section coupled to respective anodes of a first plurality of Schottky diode elements with the cathodes of the diode elements coupled to a signal ground, while the second NLTL includes an input section coupled to respective cathodes of a second plurality of Schottky diode elements, the anodes of the diode elements coupled to the signal ground. Such a configuration provides for sharpening of both the rising and falling edge of the pulse segments. In some embodiments, the sharpening circuit is implemented as an integrated circuit, such as a monolithic microwave integrated circuit (MMIC).

In still other embodiments, an integrated circuit is provided for synthesizing a waveform that generates a flat output spectrum in a selected frequency band. The integrated circuit includes a substrate and a pulse shaping circuit having a pulse shaping circuit input divider dividing an input signal into a first pulse shaping circuit signal instance and a second pulse shaping circuit signal instance. The pulse shaping circuit includes a pulse sharpening unit including a first sharpening unit coupled to the pulse shaping circuit input divider, which inputs the first pulse shaping circuit signal instance to the first sharpening unit. The first sharpening unit has a tunable delay element coupled to a first non-linear transmission line (NLTL) and outputs a first pulse.

A second sharpening unit is coupled to the pulse shaping circuit input divider, which inputs the second pulse shaping circuit signal instance to the second sharpening unit. The second sharpening unit has a second NLTL, and is coupled in parallel with the first sharpening unit. The second sharpening unit outputs a second pulse. The pulse shaping circuit further includes a pulse shaping circuit output combiner that combines the first pulse and the second pulse to produce an output pulse segment. It will be appreciated that the pulse sharpening unit is configured to sharpen a rising edge of the first pulse and a falling edge of the second pulse such that the output pulse segment includes a sharpened rising edge and a sharpened falling edge. The exemplary integrated circuit further includes a branch circuit having a branch circuit input divider that divides an input signal into a first branch circuit signal instance, a second branch circuit signal instance and a third branch circuit signal instance.

A first unit is provided having a first time delay element and one of the above described pulse shaping units. The first unit receives the first branch circuit signal instance and outputs a first one of the above described output pulse segments. The branch circuit further has a second unit having a second time delay element and another of the pulse shaping units. The second unit receives the second branch circuit signal instance and outputs a second one of the output pulse segments. The branch circuit still further has a third unit having a third time delay element and a third of the pulse shaping units. The third unit receives the third branch circuit signal instance and outputs a third of the output pulse segments. The branch circuit still further has a branch circuit output combiner for combining the first, the second and the third of the output pulse segments to form, for example, a composite waveform. The time delay elements of the first, second and third units can be adjusted so that the combined first, second and third of the output pulse segment forms the desired output waveform. It will be appreciated that either or both of the pulse shaping circuit and the branch circuit can be included in an integrated circuit configured as a monolithic microwave integrated circuit (MMIC). Further, the substrate can includes Gallium Arsenide (GaAs) or other known materials suitable for such applications.

Referring now to the drawings in which like numbers reference like components, and in which a single reference number may be used to identify an exemplary one of multiple like components, FIG. 1 shows an exemplary scenario 100, where a input signal 101, having a frequency f0 102, can be input to a comb generator 110. The comb generator 110 can produce an output having a frequency spectrum 103 with various harmonic values or tones represented as $2f_0$, $3f_0$, $4f_0$ and the like to $nf_0$. For example, for an input sinusoid of 1 GHz, the output will be harmonics of 1 GHz occurring in integral multiples of 1 GHz, in other words, having 1 GHz spacing. The actual tones may or may not be detectable based on the individual circuit characteristics and the like, since the circuit will act as a band selective filter.

It will be appreciated that while the diagram is illustrative in nature, the distribution of odd and even harmonics would be on both sides of the x axis and depend highly on the nature of the input signal 101 both in the time and frequency domain. The output spectrum 103 can be further input to devices such as a filter 104 to select more specific frequencies, a receiver 105, which can use the output spectrum 103 as an input for, for example, test purposes or the like. The output spectrum 103 can further be input to an amplifier 106. Alternatively the comb generator 110 can simply be provided as a stand alone unit for generating output spectrum 103 for whatever purpose is required.

Figure 2:
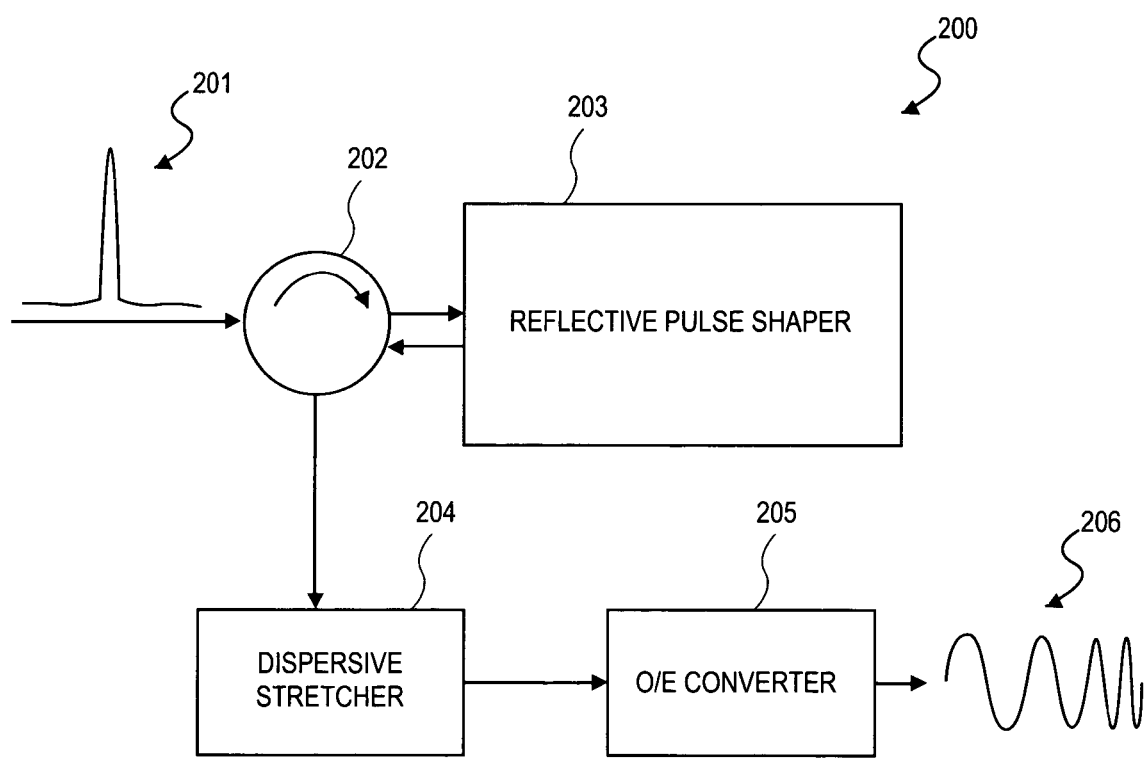
FIG. 2 is a diagram illustrating a prior art generator using optical and electrical components.

A conventional comb generator can be constructed as described above using a SRD, or can be constructed as an optical system 200, as shown in FIG. 2. An input signal 201 can be input to a circulator 202 and input to a reflective pulse shaper 203 where a reflected signal component is combined, using Fourier characteristics of a lens configuration and optical grating, with the original signal 201 at the circulator 202. The output of the circulator 202 can be input to a dispersive stretcher 204 and eventually to an optical to electrical converter 205 where an electrical signal or signals 206 can be generated.

Figure 3:
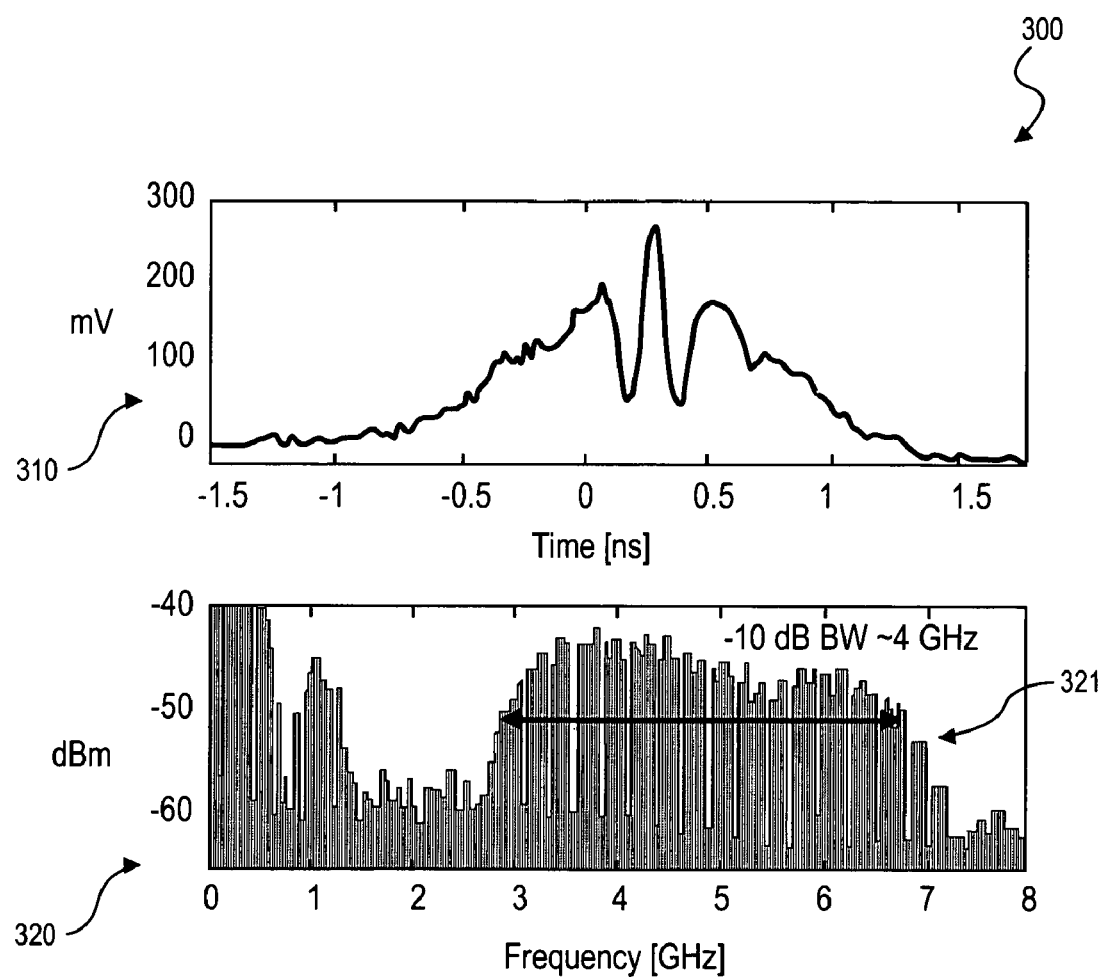
FIG. 3 is a diagram illustrating an output spectrum associated with prior art generators.

Regardless of the configuration of the conventional comb generator, what is desired in connection with scenario 300, as shown in FIG. 3, is a predictable output in the form of a spectrum based on a given input. With reference to the upper graph 310, a signal having a time domain component is shown in the graph with a sub-nanosecond pulse width, perhaps totaling around 0.5 nanoseconds. The signal can be input, for example, to a conventional comb generator where it produces an output spectrum shown in the lower graph 320. The desired spectrum 321 is shown as having a bandwidth of around from 3 GHz to around 7 GHz. Limitations associated with scenario 300 can be seen in the form of out-of-band energy, visible in the lower frequency bands, such as at the left part of lower graph 320 outside the desired spectrum 321. The out of band signal components can be considered as wasted energy or as a reflection of the overall operational inefficiency of the generator.

Figure 4:
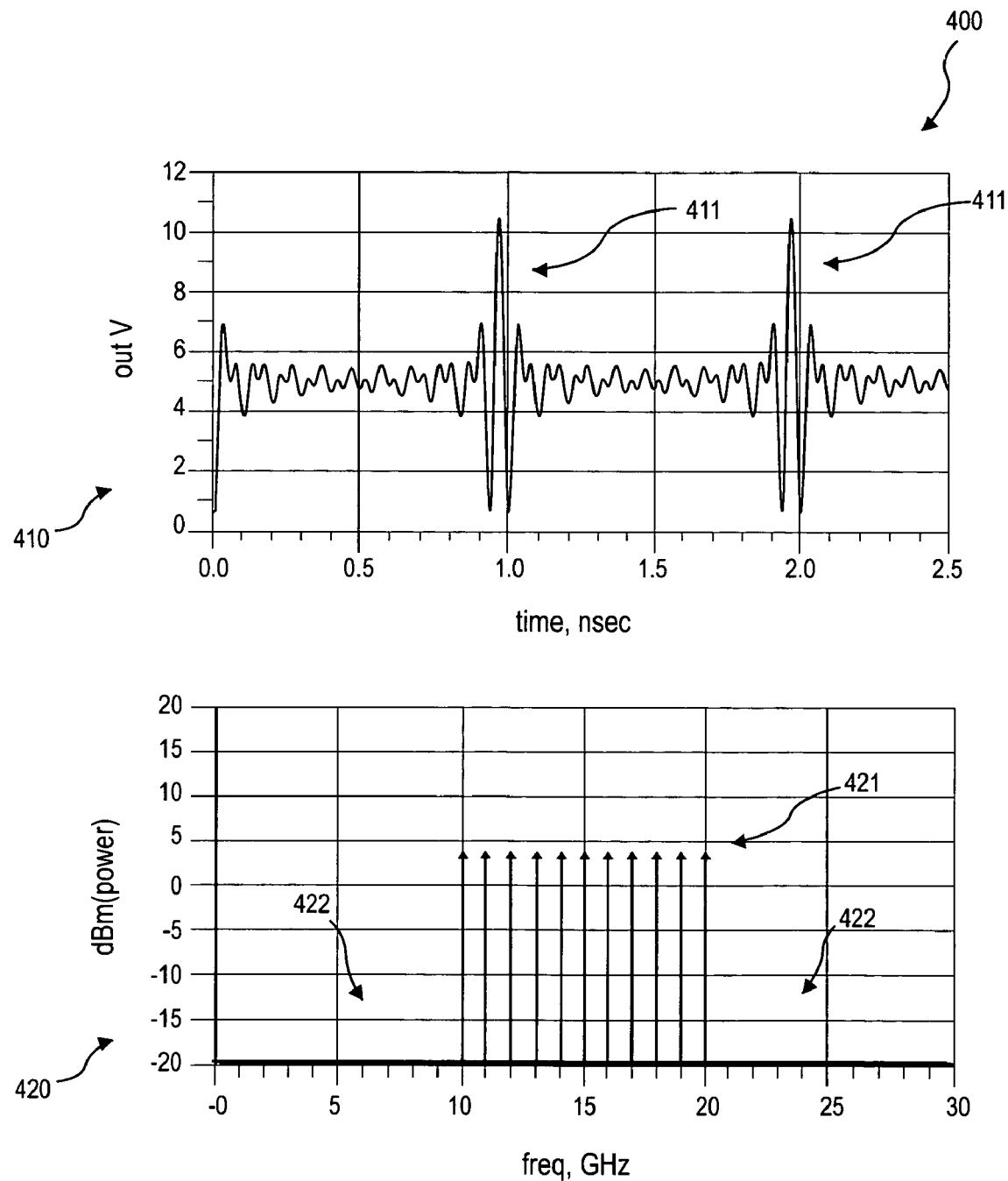
FIG. 4 is a diagram illustrating an exemplary input signal and output spectrum in accordance with the invention.

In contrast, a more ideal scenario 400, as shown in FIG. 4, in accordance with various exemplary embodiments, can result from carefully controlling the time domain aspects of the input signal. In the upper graph 410, a time domain pulse 411 is shown as occurring every nanosecond and having a pulse width more along the order of around 0.1 nanosecond for an input frequency of around 1 GHz, representing a nearly 80% improvement in the time domain sharpness. The resulting desired output spectrum 421, from around 10 GHz to around 20 GHz has a flat in-band characteristic, sharp out-of-band cut-off characteristics, and little or no out-of-band energy as shown in regions 422.

Figure 5:
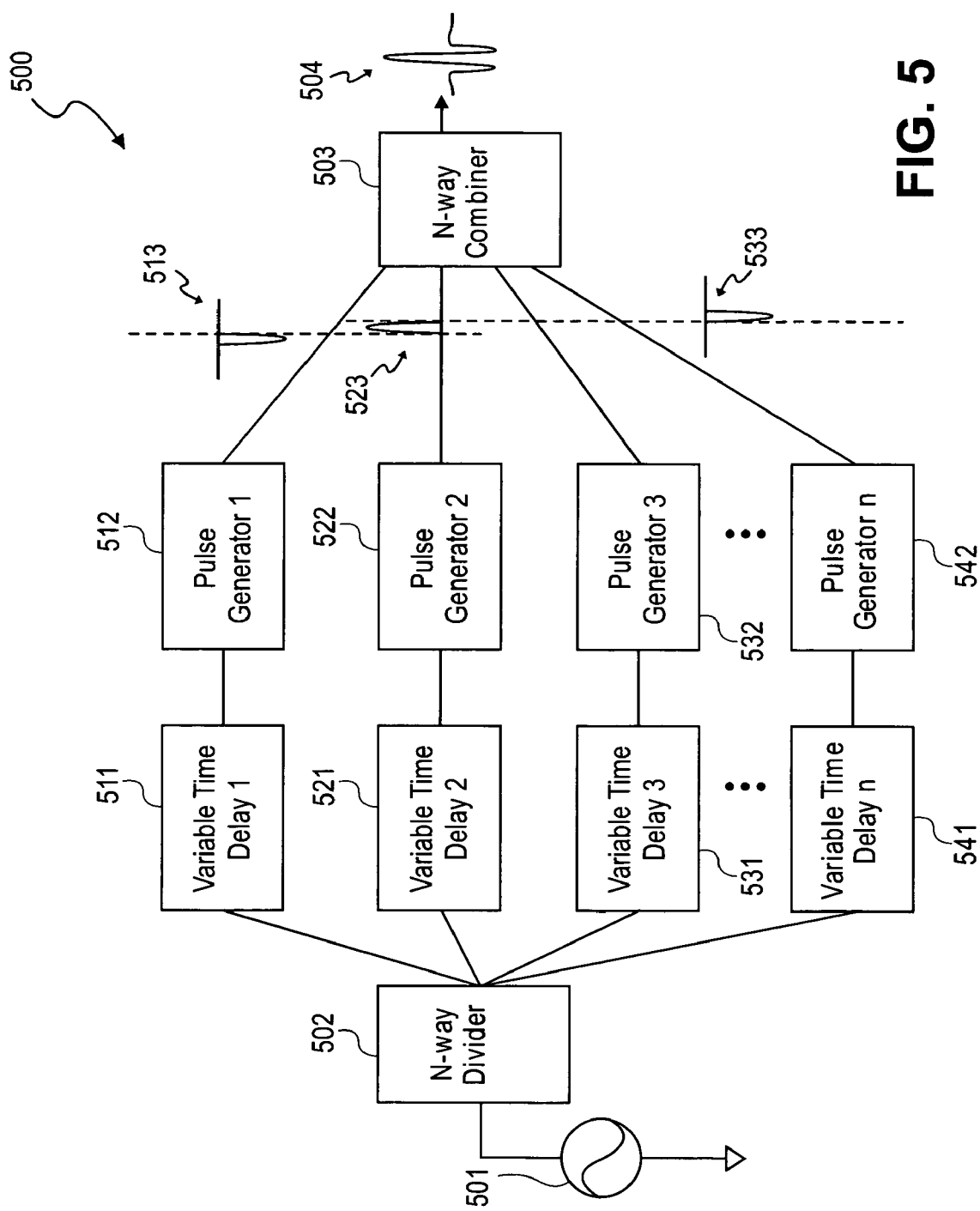
FIG. 5 is a block diagram illustrating an exemplary comb generator in accordance with the invention.

In order to generate or otherwise synthesize a time domain pulse capable of generating the flat output spectrum, for example as shown in FIG. 4, an exemplary comb generator 500 is shown in FIG. 5 that uses separate units to form pulse segments that are combined to form the spectrum generating waveform. Accordingly, a signal generator 501 can be used to generate an input signal such as a sinusoidal signal y(t) at a frequency corresponding to the desired output spectrum in accordance with the well known Fourier series relation in Equation (1) and (2).

$$y(t) = \sum_{n=-\infty}^{\infty} c_n e^{jn\omega t} \quad (1)$$

where $$c_n = \hat{c}_{-n}$$

$$c_n = \frac{1}{T}\int_{-T/2}^{T/2} y(t) e^{-jn\omega t} dt \quad (2)$$

In accordance with Fourier principles, $c_n$ is a complex number that gives the discrete amplitude spectrum of the periodic signal. It will be appreciated that as the input signal approaches the ideal impulse, which is infinitesimally small in width and large in amplitude, the spectrum will be unboundedly wide.

In order therefore to control the characteristics of the output spectrum of the comb generator 500, the quality of the time domain waveform must be carefully controlled as will be described herein. The input signal from signal generator 501 is therefore input to an input divider 502, shown as a three-way divider, which generates balanced signal instances, that is signals that are identical in all regards including phase, amplitude, frequency and the like, for inputting to various branches of an exemplary branch circuit. While the input divider 502 is shown as a three way divider corresponding to the three branches of the exemplary branch circuit, more branches and thus more signals can be divided in accordance with alternative embodiments.

A signal instance can be input into each of three variable time delay units such as a variable time delay unit 1 511, a variable time delay unit 2 521, a variable time delay unit 3 531 and, optionally additional units up to a variable time delay unit n 541. Variable time delay unit 1 511, variable time delay unit 2 521, variable time delay unit 3 531 and, optionally, up to variable time delay unit n 541 are respectively coupled to a pulse generator 1 512, a pulse generator 2 522, a pulse generator 3 532 and, optionally, a pulse generator n 542. Each branch of the exemplary branch circuit can produce a pulse segment. For example, the branch including variable time delay unit 1 511 and pulse generator 1 512 can produce pulse segment 513. By varying the amount of time delay produced in variable time delay unit 1 511, the position and orientation of the pulse segment 513 in time can be controlled. The branch including variable time delay unit 2 521 and pulse generator 1 522 can produce pulse segment 523. By varying the amount of time delay produced in variable time delay unit 2 521, the position and orientation of the pulse segment 523 in time can be controlled. The branch including variable time delay unit 3 531 and pulse generator 3 532 can produce pulse segment 533. By varying the amount of time delay produced in variable time delay unit 3 531, the position and orientation of the pulse segment 533 in time can be controlled. After the input signal instances have propagated in the branches and pulse segments 513, 523 and 533 are produced, they can be combined in three-way combiner 503 to produce or synthesize a composite time domain waveform 504 having the desired properties associated with a narrow pulse width.

Figure 6A:
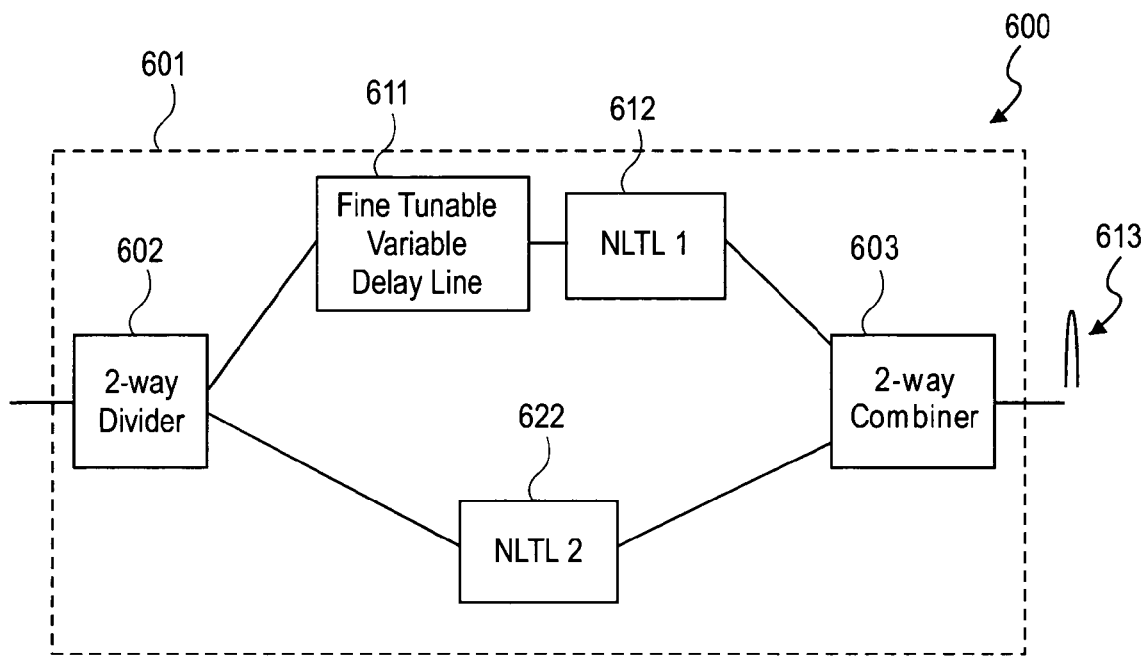
FIG. 6A is a block diagram illustrating a pulse generator in accordance with various exemplary embodiments.

As previously discussed, the narrowness of the exemplary time domain pulse 504 determines the quality of the output spectrum associated therewith and therefore the quality of the overall output spectrum associated with the exemplary comb generator 500. In order to achieve control over time domain pulse 504, each of the pulse generators, pulse generator 1 512, pulse generator 2 522 and pulse generator 3 532 can include an exemplary pulse shaping circuit 600, as shown for example in FIG. 6A. The pulse shaping circuit 600 can be implemented entirely as an integrated circuit 601 or portions thereof can be integrated such as in a monolithic microwave integrated circuit (MMIC). The MMIC substrate can include Indium Phosphide (InP), Gallium Nitride (GaN), Silicon (Si), Silicon Germanium (SiGe), and the like.

The input signal, for example, possibly as adjusted by one of variable time delay unit 1 511, variable time delay unit 2 521 and variable time delay unit 3 531 to which it may be coupled, can be divided in a two way divider 602 to produce two balanced instances of the input signal. A first instance of the input signal can be input to a finely tunable delay line 611 coupled in turn to a first non-linear transmission line (NLTL) 1 612. The second instance of the input signal can be input to a second NLTL 2 622. The operation of NLTL 1 612 and NLTL 2 622 involve sharpening the rising edge of one signal instance and sharpening the falling edge of the other signal instance depending on the configuration of each NLTL.

Figure 6B:
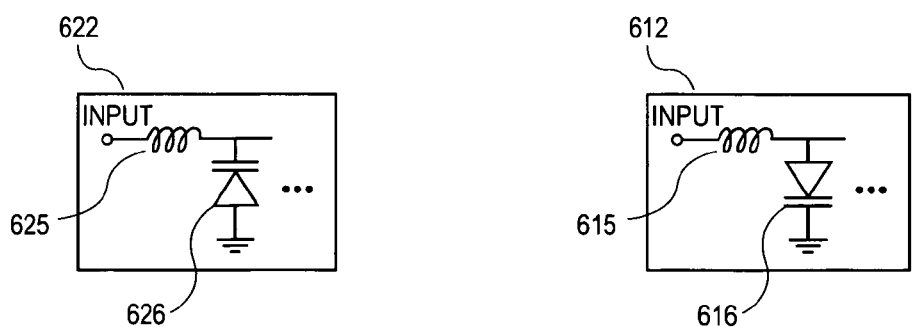
FIG. 6B is a diagram illustrating exemplary circuit components of non linear transmission lines (NLTLs) in accordance with various exemplary embodiments.

For example, as shown in FIG. 6B, if NLTL 2 622 is configured as shown, the input signal will be input to a network including an inductive reactance component 625 and a Schottky diode 626 with a capacitive component. A series of such elements can be used to construct the NLTL and are responsible for the pulse sharpening behavior of the NLTL. In the case of NLTL 2 622, the cathode is coupled to the signal input and the anode is coupled to signal ground resulting in a sharpening of the rising edge of the signal. In the case of NLTL 1 612, the cathode is coupled to signal ground and the anode is coupled to the signal input resulting in a sharpening of the falling edge of the signal. It will be appreciated that finely tunable delay line 611 can be used to precisely position the rising and falling edges with respect to each other. After the signal instances are combined at two way combiner 603, a pulse segment 613 having sharpened rising and falling edges can be produced. It will be appreciated that a series of the exemplary pulse shaping circuits 600 can be used to form the exemplary comb generator 500.

Figure 7:
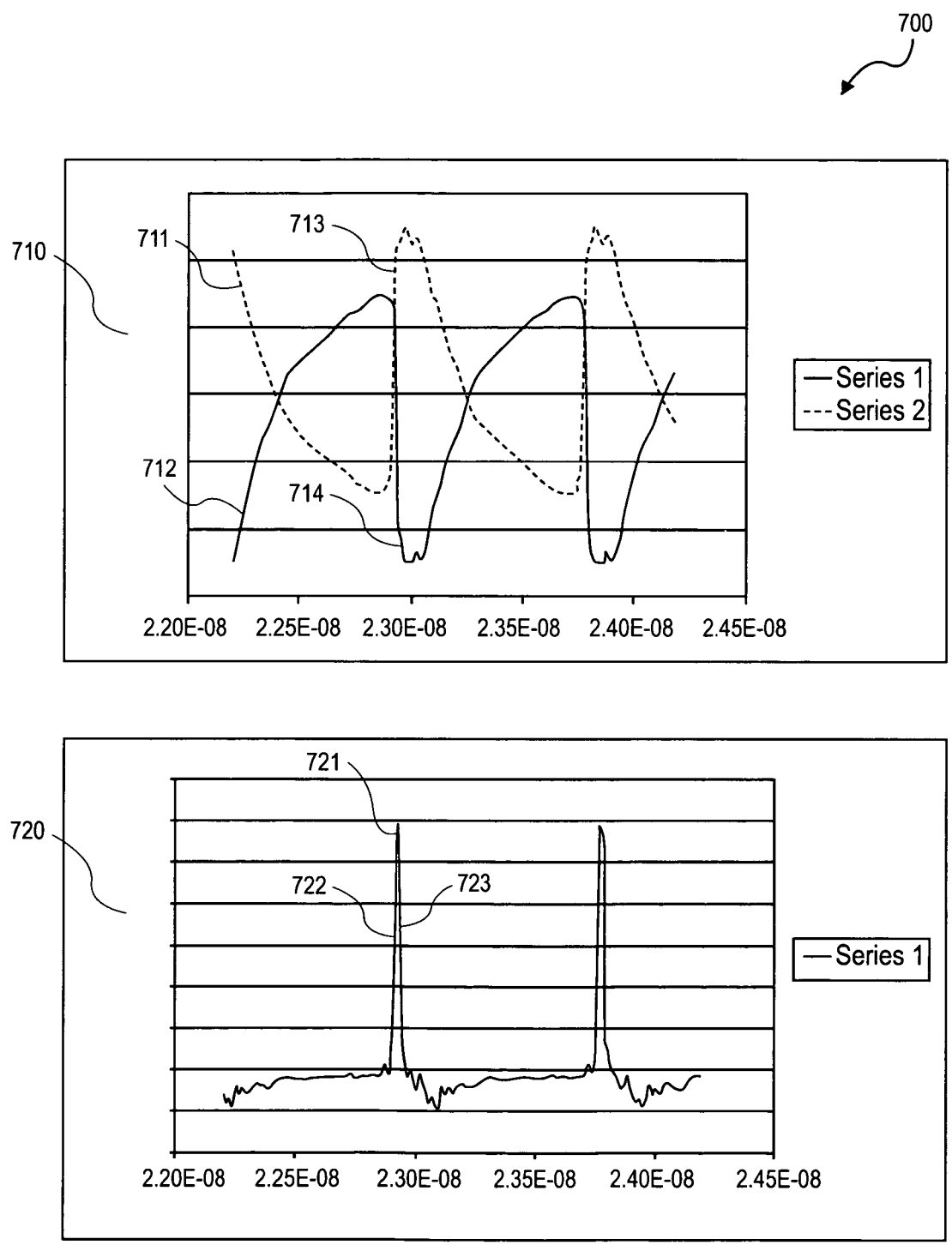
FIG. 7 is a diagram illustrating exemplary signal components of the pulse generator of FIG. 6A in accordance with various exemplary embodiments.

To better understand the operation of the exemplary pulse shaping circuit 600 as described in connection with FIG. 6, a graph of the outputs of NLTL 1 612 and NLTL 2 622 and the output of the two way combiner 603 are shown in FIG. 7. In the upper graph 710 a first trace 711 shows a sharpened rising edge 713 and a second trace 712 shows a sharpened falling edge 714. It will be appreciated that either the rising edge or the falling edge can be sharpened by either of NTLT 1 612 and NLTL 2 622 depending on the individual configuration of the NLTL. However for proper operation each of NTLT 1 612 and NLTL 2 622 should be configured to sharpen a different one of the rising edge or the falling edge. When the signals 711 and 712 are combined, such as in combiner 603, a resulting pulse can be formed as shown in lower graph 720. The pulse 721 can have a sharp rising edge 722 and a sharp falling edge 723 and the relationship between the edges in time can be adjusted to a degree by the finely tunable delay line 611.

Figure 8:
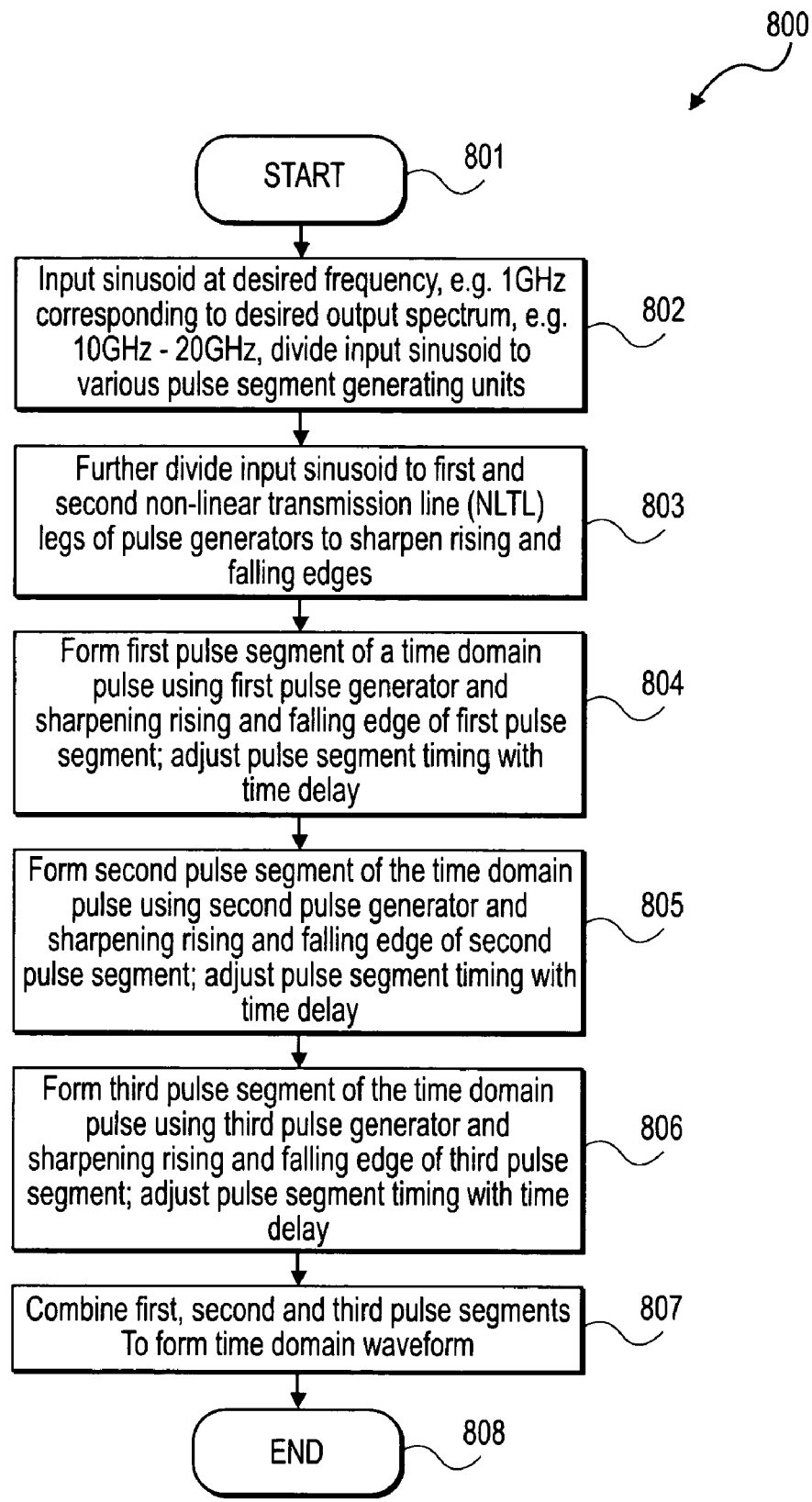
FIG. 8 is a flowchart illustrating exemplary signal components of the pulse generator of FIG. 6A in accordance with various exemplary embodiments.

The above noted operation can further be embodied as an exemplary method 800 for synthesizing a waveform, such as a time domain waveform as shown in FIG. 8. After start at 801, a sinusoid at a desired frequency, such as 1 GHz, associated with a desired output spectrum, such as from around 10 GHz to around 20 GHz can be divided an input to pulse segment generating units or branches at 802. Within each branch, the input signal can further be divided to first and second NLTL pulse sharpening units to sharpen rising and falling edges respectively at 803. Within the first branch a first pulse segment can be formed using one of the NLTL pulse generators so that the rising and falling edges of the pulse segment can be sharpened, and adjusted in time at 804. In the second branch, in essentially a simultaneous manner, a second pulse segment can be formed using another of the NLTL pulse generators so that the rising and falling edges of the pulse segment can be sharpened, and adjusted in time at 805. In the third branch, again, in essentially a simultaneous manner, a third pulse segment can be formed using still another of the NLTL pulse generators so that the rising and falling edges of the pulse segment can be sharpened, and adjusted in time at 806. The pulse segments are combined at 807 to form the time domain waveform. While the exemplary procedure is indicated as ending at 808 it will be appreciated that the procedure is repeated for every period of the sinusoidal input signal.

The present examples and embodiments are to be considered as illustrative and not restrictive and the invention is not to be limited to the details given herein, but may be modified within the scope and equivalence of the appended claims.

What is claimed is:

1. A method for synthesizing a time domain waveform having a flat output spectrum in a selected frequency band, comprising:
   forming a first pulse segment associated with the time domain waveform using a first non-linear transmission line (NLTL) pulse generator;
   forming a second pulse segment associated with the time domain waveform using a second NLTL pulse generator;
   forming a third pulse segment associated with the time domain waveform using a third NLTL pulse generator; and
   combining the first pulse segment, the second pulse segment and the third pulse segment to form the time domain waveform,
   wherein the first pulse segment, the second pulse segment and the third pulse segment are formed by inputting a sinusoidal waveform having a predetermined frequency associated with the selected frequency band, into the first pulse generator, the second pulse generator and the third pulse generator respectively.

2. The method according to claim 1, wherein the first pulse segment, the second pulse segment and the third pulse segment are formed by the first pulse generator, the second pulse generator and the third pulse generator respectively by sharpening a rising edge and a falling edge of each of the first pulse segment, the second pulse segment and the third pulse segment as the sinusoidal waveform propagates in the first pulse generator, the second pulse generator and the third pulse generator.

3. The method according to claim 2, wherein the sharpening the rising edge and the falling edge includes:
   dividing the sinusoidal waveform into a first waveform instance and a second waveform instance;
   inputting the first waveform instance into a first tunable delay element coupled to a first NLTL and inputting the second waveform instance into a second NLTL; and
   tuning the first tunable delay element to sharpen the rising edge and the falling edge.

4. The method according to claim 2, wherein the selected frequency band includes from around 10 GHz to around 20 GHz.

5. The method according to claim 2, wherein the predetermined frequency includes 1 GHz.

6. A waveform synthesizer for synthesizing a waveform having a first pulse segment, a second pulse segment and a third pulse segment, the wave form generating a flat output spectrum in a selected frequency band, the waveform synthesizer comprising:
   a first unit having a first time delay element and a first pulse generator generating the first pulse segment, a second unit having a second time delay element and a second pulse generator generating the second pulse segment, and a third unit having a third time delay element and a third pulse generator generating the third pulse segment, the first unit, the second unit and the third unit connected in parallel; and
   an input divider coupled to respective inputs of the first unit, the second unit, and the third unit the input divider dividing an input signal into a first signal instance, a second signal instance and a third signal instance that propagate through the first unit the second unit and the third unit to form the first pulse segment, the second pulse segment and the third pulse segment respectively, and an output combiner coupled to respective outputs of the first unit, the second unit, and the third unit combining the first pulse segment, the second pulse segment and the third pulse segment to form the waveform, wherein:

each of the first pulse generator, the second pulse generator, and the third pulse generator include a sharpening circuit for sharpening a rising edge and a falling edge of the first pulse segment, the second pulse segment and the third pulse segment, the sharpening circuit comprising:

a tunable delay element coupled to a first non-linear transmission line (NLTL); and a second NLTL coupled in parallel with the tunable delay element and the first NLTL.

7. The waveform synthesizer according to claim 6, wherein the input signal includes a sinusoidal waveform having a frequency of 1 GHz.

8. The waveform synthesizer of claim 6, wherein the selected frequency band includes from around 10 GHz to around 20 GHz.

9. The waveform synthesizer according to claim 6, wherein the first NLTL includes an input section coupled to respective anodes of a first plurality of Schottky diode elements, the cathodes of the first plurality of Schottky diode elements coupled to a signal ground, and the second NLTL includes an input section coupled to respective cathodes of a second plurality of Schottky diode elements, the anodes of the second plurality of Schottky diode elements coupled to the signal ground.

10. The waveform synthesizer according to claim 6, wherein the first NLTL includes an input section coupled to respective cathodes of a first plurality of Schottky diode elements, the anodes of the first plurality of Schottky diode elements coupled to a signal ground, and the second NLTL includes an input section coupled to respective anodes of a second plurality of Schottky diode elements, the cathodes of the second plurality of Schottky diode elements coupled to the signal ground.

11. The waveform synthesizer according to claim 6, wherein at least the sharpening circuit is implemented as an integrated circuit.

12. The waveform synthesizer according to claim 6, wherein at least the sharpening circuit is implemented as a monolithic microwave integrated circuit (MMIC).

13. An integrated circuit for synthesizing a waveform generating a flat output spectrum in a selected frequency band, the integrated circuit comprising:

a substrate: and a pulse shaping circuit having:

an pulse shaping circuit input divider dividing an input signal into a first pulse shaping circuit signal instance and a second pulse shaping circuit signal instance;

a pulse sharpening unit including:

a first sharpening unit coupled to the pulse shaping circuit input divider, the pulse shaping circuit input divider inputting the first pulse shaping circuit signal instance to the first sharpening unit, the first sharpening unit having a tunable delay element coupled to a first non-linear transmission line (NLTL), the first sharpening unit outputting a first pulse; and a second sharpening unit coupled to the pulse shaping circuit input divider, the pulse shaping circuit input divider inputting the second pulse shaping circuit signal instance to the second sharpening unit, the second sharpening unit having a second NLTL, the second sharpening unit coupled in parallel with the first sharpening unit, the second sharpening unit outputting a second pulse; and a pulse shaping circuit output combiner combining the first pulse and the second pulse to produce an output pulse segment, wherein the pulse sharpening unit is configured to sharpen a rising edge of the first pulse and a falling edge of the second pulse such that the output pulse segment includes a sharpened rising edge and a sharpened falling edge.

14. The integrated circuit according to claim 13, further comprising:

a branch circuit having:

a branch circuit input divider dividing an input signal into a first branch circuit signal instance, a second branch circuit signal instance and a third branch circuit signal instance;

a first unit having a first time delay element and a first of the pulse shaping unit, the first unit receiving the first branch circuit signal instance and outputting a first of the output pulse segment;

a second unit having a second time delay element and a second of the pulse shaping unit, the second unit receiving the second branch circuit signal instance and outputting a second of the output pulse segment;

a third unit having a third time delay element and a third of the pulse shaping unit, the third unit receiving the third branch circuit signal instance and outputting a third of the output pulse segment; and a branch circuit output combiner combining the first, the second and the third of the output pulse segment, wherein at least one of the first time delay element, the second time delay element and the third time delay element are adjusted so that the combined first, second and third of the output pulse segment forms the waveform.

15. The integrated circuit of claim 13, wherein the pulse shaping circuit is included in a monolithic microwave integrated circuit (MMIC).

16. The integrated circuit of claim 14, wherein the pulse shaping circuit and the branch circuit are included in a monolithic microwave integrated circuit (MMIC).

17. The integrated circuit of claim 13, wherein the substrate includes a Gallium Arsenide (GaAs) substrate.

18. The integrated circuit of claim 14, wherein the substrate includes a Gallium Arsenide (GaAs) substrate.

19. The integrated circuit of claim 15, wherein the substrate includes a Gallium Arsenide (GaAs) substrate.

20. The integrated circuit of claim 16, wherein the substrate includes a Gallium Arsenide (GaAs) substrate.

* * * * *